United States Patent
Zou et al.

(10) Patent No.: US 10,139,686 B2
(45) Date of Patent: Nov. 27, 2018

(54) ARRAY SUBSTRATE, LIQUID CRYSTAL DISPLAY PANEL AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Zhixiang Zou, Beijing (CN); Binbin Cao, Beijing (CN); Chengshao Yang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 28 days.

(21) Appl. No.: 15/209,045

(22) Filed: Jul. 13, 2016

(65) Prior Publication Data

US 2017/0192316 A1    Jul. 6, 2017

(30) Foreign Application Priority Data

Jan. 5, 2016  (CN) .......................... 2016 1 0007055

(51) Int. Cl.
*H01L 27/12* (2006.01)
*G02F 1/1333* (2006.01)
(Continued)

(52) U.S. Cl.
CPC .... *G02F 1/134336* (2013.01); *G02F 1/13439* (2013.01); *G02F 1/133345* (2013.01);
(Continued)

(58) Field of Classification Search
CPC ..................... G02F 1/134336; G02F 1/134309
See application file for complete search history.

(56) References Cited

U.S. PATENT DOCUMENTS 6,765,642 B2 * 7/2004 Lee ................... G02F 1/133707
                                                    349/141
7,830,483 B2 * 11/2010 Ohno ................ G02F 1/136286
                                                    349/111
(Continued)

FOREIGN PATENT DOCUMENTS

CN    102135691 A    7/2011
CN    102937767 A    2/2013
(Continued)

OTHER PUBLICATIONS

Boher, "Optical properties of a transparent LCD", Dec. 2016, IDW/AD 2016, 5 pages.*
(Continued)

*Primary Examiner* — Whitney Moore
(74) *Attorney, Agent, or Firm* — Westman, Champlin & Koehler, P.A.

(57) ABSTRACT

The embodiment of the present application discloses an array substrate, a liquid crystal display panel, and a display device, with first common electrode compensation lines being arranged within pixel regions which correspond to pixels provided with a minimal transmittance, by which first common electrode compensation lines a common electrode is charged so as to ensure a constant voltage on the common electrode. Moreover, since the first common electrode compensation lines are configured to overlap neither first signal lines nor second signal lines, a repairmen of the first signal lines or the second signal lines will not be adversely affected in case that there is short-circuit or open-circuit thereon. Besides, since the common electrode compensation lines are arranged within pixel regions provided with the lowest transmittance, the influence onto overall transmittance of the display panel is minimized relatively.

20 Claims, 10 Drawing Sheets

(51) Int. Cl.
*G02F 1/1343* (2006.01)
*G02F 1/1362* (2006.01)

(52) U.S. Cl.
CPC ...... *G02F 1/136286* (2013.01); *H01L 27/124* (2013.01); *G02F 2001/134318* (2013.01); *G02F 2001/136295* (2013.01); *G02F 2201/121* (2013.01); *G02F 2201/123* (2013.01); *G02F 2203/01* (2013.01)

(56) References Cited

U.S. PATENT DOCUMENTS

| | | | | |
|---|---|---|---|---|
| 8,314,762 | B2 * | 11/2012 | Park | G02F 1/136286 345/103 |
| 8,610,860 | B2 | 12/2013 | Huang et al. | |
| 9,035,932 | B2 * | 5/2015 | Huang | G09G 3/3648 345/211 |
| 9,250,465 | B2 | 2/2016 | Ma et al. | |
| 9,442,337 | B2 * | 9/2016 | Park | G02F 1/136286 |
| 9,570,472 | B2 | 2/2017 | Huang et al. | |
| 2001/0005247 | A1 * | 6/2001 | Kikkawa | G02F 1/1395 349/117 |
| 2004/0109120 | A1 * | 6/2004 | Lee | G02F 1/134363 349/141 |
| 2008/0303967 | A1 * | 12/2008 | Huang | G09G 3/3655 349/39 |
| 2009/0109363 | A1 * | 4/2009 | Yu | G02F 1/134309 349/43 |
| 2009/0128536 | A1 * | 5/2009 | Seo | G09G 3/3655 345/211 |
| 2009/0135125 | A1 * | 5/2009 | Park | G02F 1/136286 345/98 |
| 2013/0222724 | A1 * | 8/2013 | Ueda | G09G 3/3655 349/42 |
| 2014/0062981 | A1 * | 3/2014 | Huang | G09G 3/3648 345/211 |
| 2015/0160489 | A1 * | 6/2015 | Kim | G02F 1/134309 349/139 |
| 2016/0189642 | A1 * | 6/2016 | Shin | G09G 3/3648 345/690 |
| 2016/0216578 | A1 * | 7/2016 | Lee | G02F 1/1362 |
| 2016/0252786 | A1 * | 9/2016 | Xian | G02F 1/134336 349/143 |
| 2016/0266450 | A1 * | 9/2016 | Kim | G02F 1/133514 |
| 2017/0322441 | A1 * | 11/2017 | Matsushima | G06F 3/044 |

FOREIGN PATENT DOCUMENTS

| | | |
|---|---|---|
| CN | 103941496 A | 7/2014 |
| JP | 2014-11317 A | 1/2014 |

OTHER PUBLICATIONS

First Office Action, including Search Report, for Chinese Patent Application No. 201610007055.4, dated Mar. 29, 2018, 13 pages.

* cited by examiner

ARRAY SUBSTRATE, LIQUID CRYSTAL DISPLAY PANEL AND DISPLAY DEVICE

CROSS-REFERENCE TO RELATED APPLICATION

The present application claims the benefit of Chinese Patent Application No. 201610007055.4 filed on Jan. 5, 2016 in the State Intellectual Property Office of China, the whole disclosure of which is incorporated herein by reference.

BACKGROUND OF THE INVENTION

Field of the Invention

Embodiments of the present application relate to the technical field of liquid crystal display technology, and in particular, to an array substrate having common electrode compensation lines, a liquid crystal display panel, and a display device.

Description of the Related Art

With display technology becoming mature increasingly, a higher requirement for better display quality arises. In general, a liquid crystal display panel comprises an array substrate and a color filter substrate disposed to be cell-aligned and bonded together, with a liquid crystal layer therebetween. On the array substrate, as illustrated in FIG. 1a, in order to increase aperture ratio, common electrode 01 is formed in each pixel region, e.g., by adopting transparent electrically conductive film ITO (Indium Tin Oxide); however, since ITO with its higher electrical resistance suffers from an interference originating from metallic conducting wires such as data lines, gate lines and the like on the array substrate such that a condition of a unstable voltage is induced, resulting in a risk of occurrence of greenish phenomenon.

Currently, for solving such problem, as illustrated in FIG. 1b, the common electrode 02 is designed typically in a segmented manner for charging the common electrode 01, so as to ensure a constant voltage of the common electrode 01. In order to ensure that the aperture ratio is not affected, by way of example, the common electrode compensation line 02 is arranged to overlap the data lines; however, such overlapping would introduce a non-repairable or non-serviceable failure of open-circuit or short-circuit on the data lines, resulting in a lowered product yield.

SUMMARY OF THE INVENTION

The present application has been made to overcome or alleviate at least one aspect of the above mentioned disadvantages and/or shortcomings in the prior art. One main object of the exemplary embodiment of the present application is to provide an array substrate, a liquid crystal display panel, and a display to ensure that a later repairmen of data lines will not be affected and an influence on transmittance will be alleviated, in case of a common electrode.

Following technical solutions are adopted in the exemplary embodiments of the application for achieving the above desired technical purposes.

According to an aspect of the exemplary embodiment of the present application, there is provided an array substrate, comprising: a substrate; a plurality of first signal lines and a plurality of second signal lines on the substrate, the plurality of first signal lines being arranged in parallel in a first layer and the plurality of second signal lines being also arranged in parallel in a second layer, the plurality of first signal lines being intersected with and insulated from the plurality of second signal lines; a plurality of pixel regions each of which is defined collectively by every two adjacent first signal lines and every two adjacent second signal lines; and common electrodes located within respective pixel region defined by the adjacent first signal lines and the adjacent second signal lines, wherein a plurality of first common electrode compensation lines are provided, each of which is provided within respective pixel region which corresponds to a pixel with the lowest transmittance and is electrically connected with a corresponding common electrode within the pixel region; and the first common electrode compensation line is insulated from both the first signal lines and the second signal lines.

Accordingly, in another aspect of the exemplary embodiment of the present application, there is also provided a liquid crystal display panel comprising the array substrate provided by exemplary embodiments of the invention; Accordingly, in yet another aspect of the exemplary embodiment of the present application, there is further provided a display device comprising the liquid crystal display panel provided by exemplary embodiments of the invention.

BRIEF DESCRIPTION OF THE DRAWINGS

The above and other features and advantages of the present application will become more apparent and a more comprehensive understanding of the present application can be obtained, by describing in detail exemplary embodiments thereof with reference to the accompanying drawings, in which.

DETAILED DESCRIPTION OF PREFERRED EMBODIMENTS OF THE INVENTION

Figure 1A:
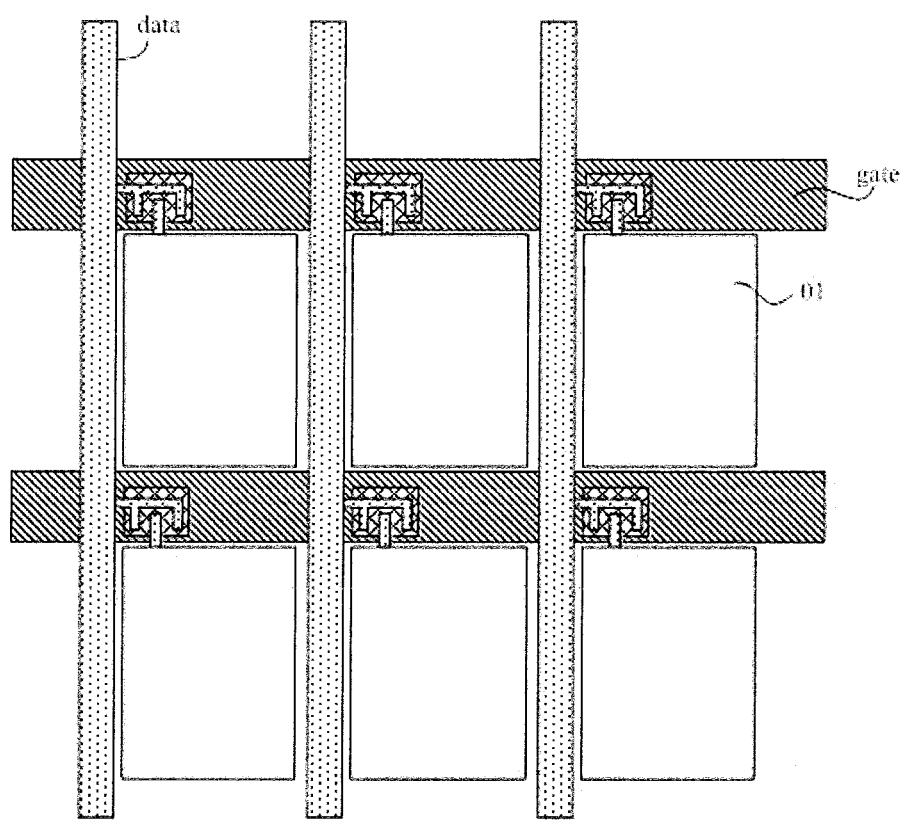
FIG. 1a and FIG. 1b are schematic structural views illustrating array substrates provided by the prior art, respectively.
Figure 1B:
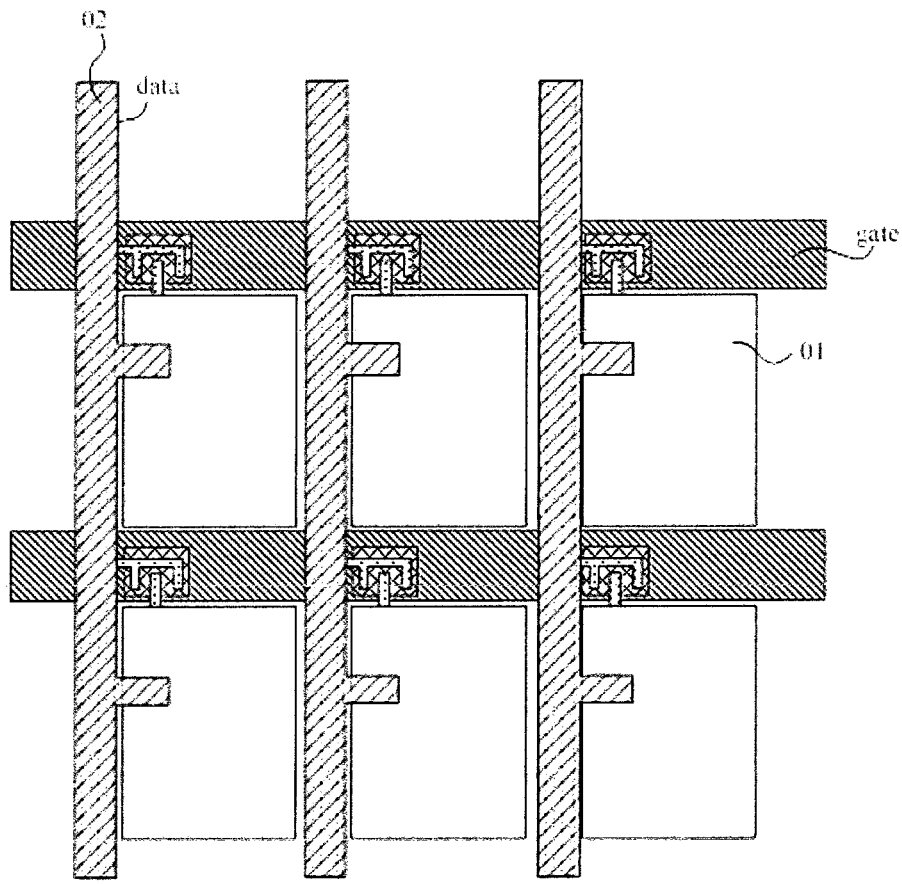

An array substrate, a liquid crystal display panel, and a display device are provided by the exemplary embodiments of the invention.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the application in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective thickness and shape of each film layer in the drawings are only intended to exemplarily illustrate the contents of the disclosure, rather than to demonstrate the practical dimension or proportion of components of the array substrate.

Figure 2A:
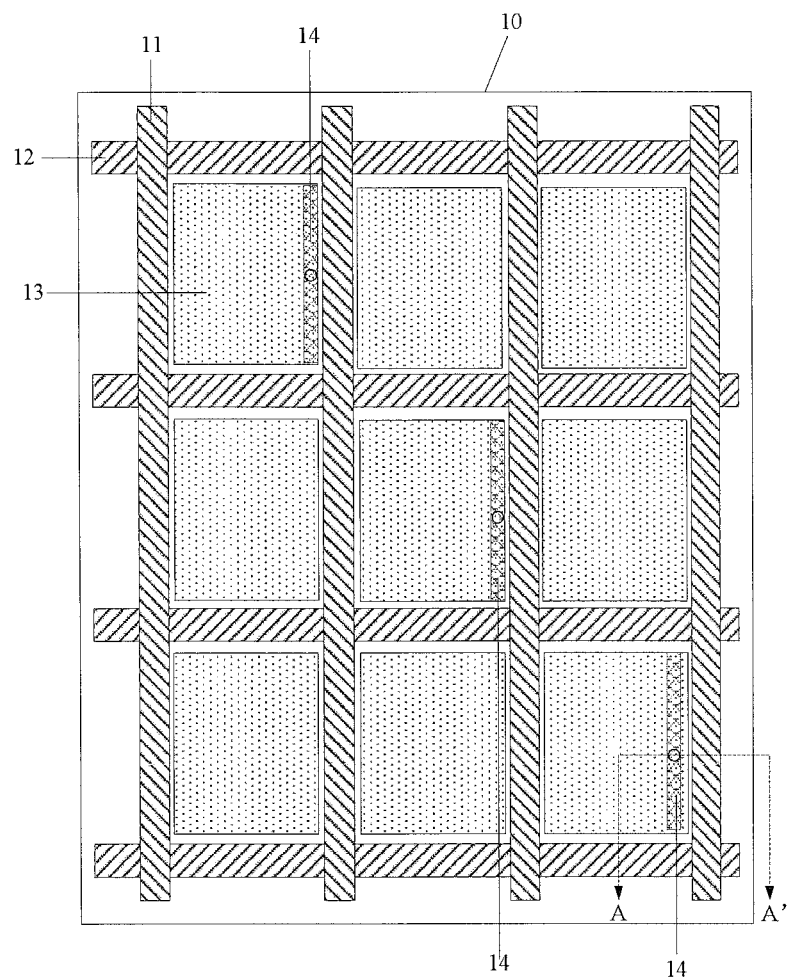
FIGS. 2a and 2b are schematic structural views illustrating an array substrate provided by exemplary embodiments of the invention, respectively.
Figure 2B:
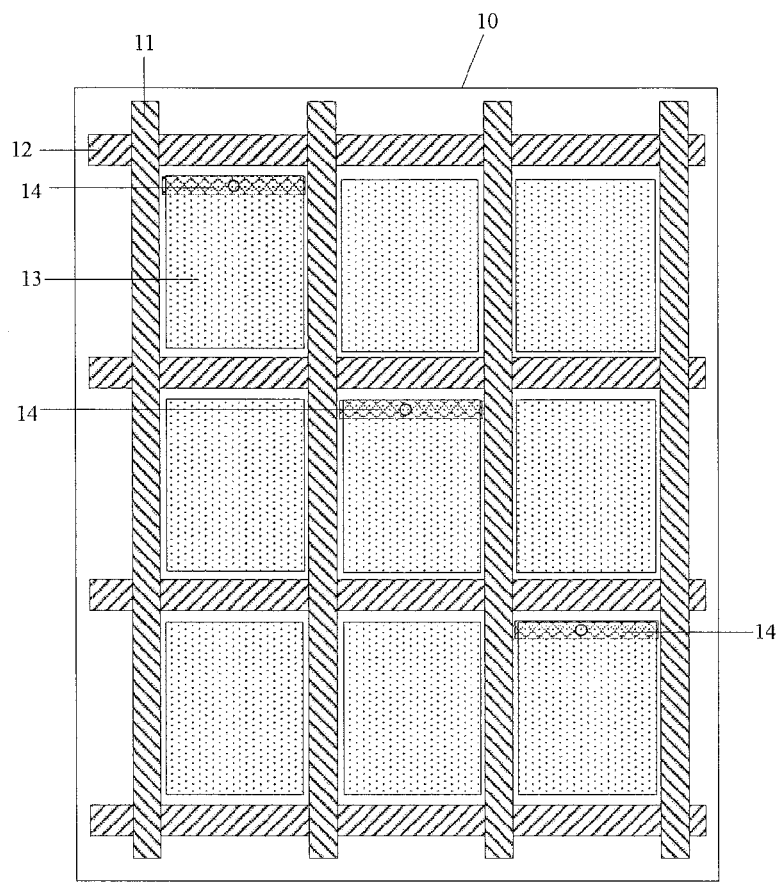

According to a general technical concept of the present application, an array substrate is provided by an exemplary embodiment of the application, as illustrated in FIG. 2a and FIG. 2b, comprising: a substrate 10; a plurality of first signal lines 11 and a plurality of second signal lines 12 on the substrate 10, for example, the plurality of first signal lines 11 being arranged in parallel in a first layer and, for example, the plurality of second signal lines 12 being also arranged in parallel in a second layer, the plurality of first signal lines 11 being intersected with and insulated from the plurality of second signal lines 12; a plurality of pixel regions each of which is defined collectively be every two adjacent first signal lines 11 and every two adjacent second signal lines 12 intersected with the every two adjacent first signal lines 11; and a common electrode 13 located within each pixel region defined by adjacent first signal lines 11 and second signal lines 12; wherein a first common electrode compensation line 14 is arranged within each of the pixel regions provided with a minimal transmittance of pixel, the first common compensation line 14 being in electrical connection with the common electrode 13; and the first common electrode compensation line 14 is insulated from both the first signal lines 11 and the second signal lines 12.

In the above array substrate provided by an exemplary embodiment of the invention, first common electrode compensation lines are arranged within pixel regions which correspond to pixels provided with a minimal transmittance, by which first common electrode compensation lines a common electrode is charged so as to ensure a constant voltage on the common electrode. Moreover, since the first common electrode compensation lines are configured to overlap neither first signal lines nor second signal lines, a repairmen of the first signal lines or the second signal lines will not be adversely affected in case that there is short-circuit or open-circuit thereon. Besides, since the common electrode compensation lines are arranged within pixel regions provided with the lowest transmittance, the influence onto overall transmittance of the display panel is minimized relatively.

During practical implementation, for example, in the above substrate provided by an exemplary embodiment of the invention, the pixels provided with a minimal transmittance are usually blue pixels. Therefore, during practical implementation, by way of example, the first common electrode compensation lines are arranged in pixel regions which correspond to blue pixels.

By way of example, during practical implementation, for simplifying drawings, when the pixel regions which correspond to pixels provided with minimal transmittance are arranged in a row direction on the array substrate, for example, correspondingly, the first common electrode compensation lines are arranged to extend in the row direction, and the first common electrode compensation lines within adjacent pixel regions which are arranged in the row direction are connected in series. Additionally or alternatively, when the pixel regions which correspond to pixels provided with minimal transmittance are arranged in a column direction on the array substrate, for example, correspondingly, the first common electrode compensation lines are arranged to extend in the column direction, and the first common electrode compensation lines within adjacent pixel regions which are arranged in the column direction are connected in series.

During practical implementation, in the above array substrate provided by an exemplary embodiment of the invention, for example, the first signal lines are data lines while the second lines are gate lines; in another exemplary embodiment, for example, the first signal lines are gate lines while the second lines are data lines. Here the specific types are not specified.

Figure 3:
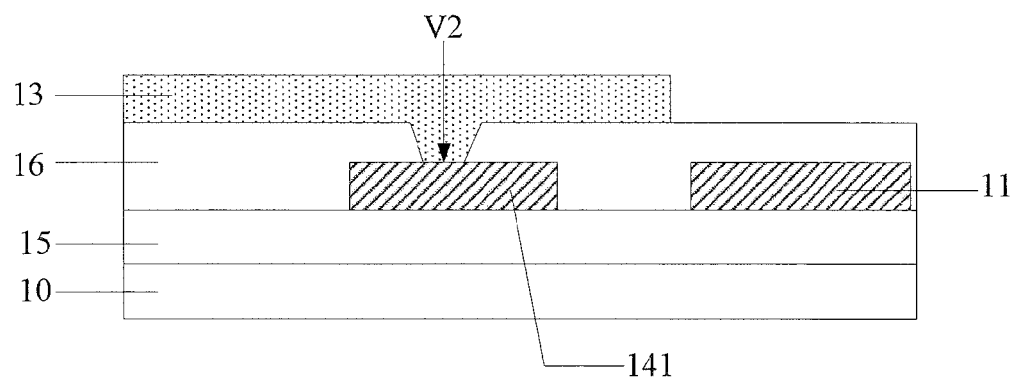
FIG. 3 is a first exemplary schematic cross section view illustrating the array substrate as illustrated in FIG. 2a, in a A-A' direction.

By way of example, in the above array substrate provided by an exemplary embodiment of the invention, as illustrated in FIG. 3, each of the first common electrode compensation lines 14 comprise a first compensation line 141 which is formed by the same material as that of the first signal lines 11 and arranged in a same layer where the first signal lines 11 are located. Besides, by way of example, the first compensation line 141 is formed by the same material as that of the first signal lines 11. As such, it is only necessary to alter original pattern upon forming the first signal lines, then the first signal lines and the first compensation lines may be formed simultaneously by a single stage patterning process without adding any individual preparation process for the first compensation lines, such that the process steps may be simplified and production cost may also be saved.

During practical implementation, when the first common electrode compensation lines function as first compensation lines solely, since it is required that the first compensation lines should be arranged to be in electrical connection with the common electrode, then, the shorter the distance between the first compensation line and the common electrode is, the easier the production processes may be.

Figure 4A:
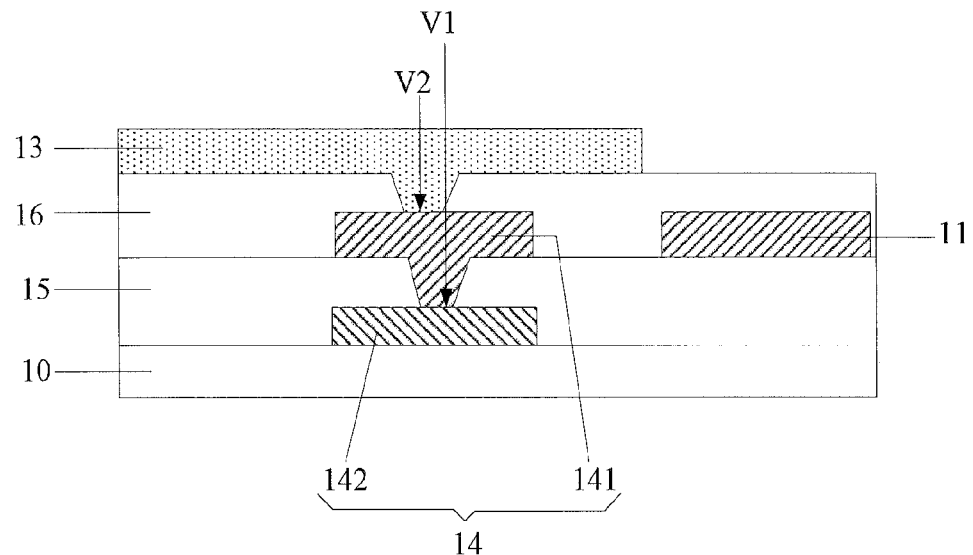
FIG. 4a is a second exemplary schematic cross section view illustrating the array substrate as illustrated in FIG. 2a, in a A-A' direction.
Figure 4B:
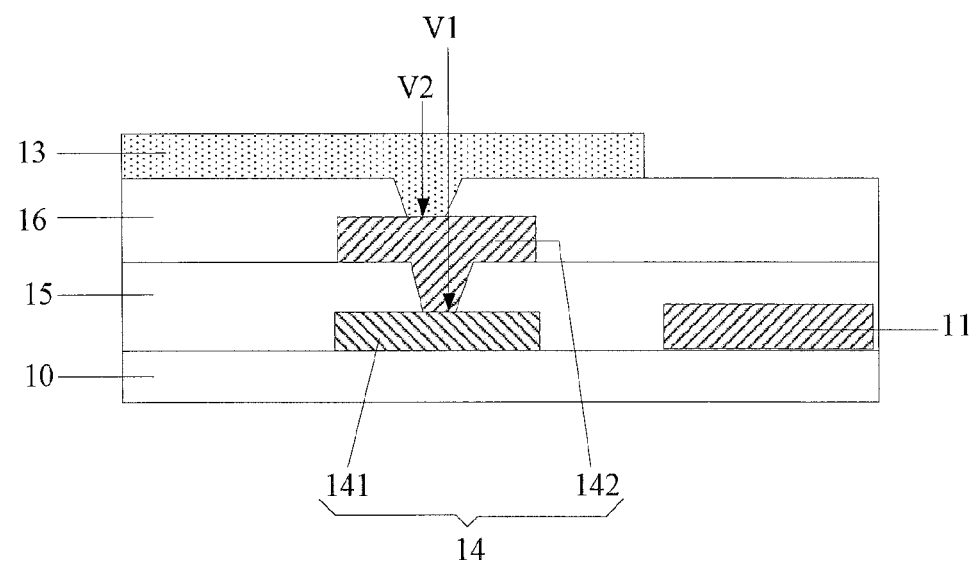
FIG. 4b is a schematic cross section view illustrating another array substrate provided by an exemplary embodiment of the invention.

By way of example, as illustrated in FIG. 4a and FIG. 4b, the first signal lines 11 and the second signal lines 12 are arranged in different layers (the second signal lines 12 is not shown since they are arranged to be orthogonal to the first signal lines 11), and above array substrate provided by the exemplary embodiment of the invention further comprises a first insulation layer 15 located between the first signal lines 11 and the second signal lines 12; each of the first common electrode compensation lines 14 further comprises a second compensation line 142 which is formed by the same material as that of the second signal lines 12 and arranged in the same layer where the second signal lines 12 are located, and an orthographic projection of the second compensation line 142 on the substrate 10 overlaps at least partially an orthographic projection of the first compensation line 141 on the substrate 10, the second compensation line 142 being in electrical connection with the first compensation line 141 via a first via-hole V1 passing through the first insulation layer 15.

This is because that, in order to ensure a constant voltage of the common electrode, it is required to decrease the electrical resistance of the first common electrode compensation lines; however, in case that the material of the first common electrode compensation lines has been defined, it is necessary to decrease the electrical resistance by increasing areas thereof, which would result in reduction of aperture ratio. Therefore, in addition to the first common electrode compensation lines, by adding the second compensation lines which are arranged to be in electrical connection with the first common electrode compensation lines, not only is the overall electrical resistance of the common electrode compensation lines reduced so as to stabilize the voltage of the common electrode, but also for example the width of the first compensation lines can be made thinner so as to minimize the influence of the first compensation lines onto the aperture ratio of the array substrate to ensure transmittance therethrough. Moreover, since the second compensation lines are arranged in the same layer in which the second signal lines are located, hereby, by altering original pattern upon formation of the second signal lines, a pattern of the first signal lines and a pattern of the second signal lines may be formed simultaneously by a single stage patterning process without addition of any processes for preparing only the second compensation lines individually, such that the process steps may be simplified and production cost may also be saved.

By way of example, in the above array substrate provided by an exemplary embodiment of the invention, orthographic projections of the second compensation line on the substrate coincide with orthographic projections of the first compensation line on the substrate. As such, it can be ensured that the influence of the arrangement of the second compensation lines onto the aperture ratio is minimized while the areas of the second compensation lines are maximized, such that the electrical resistance of compensation lines of the common electrode is minimized.

By way of example, in the above array substrate provided by an exemplary embodiment of the invention, as illustrated in FIG. 3 to FIG. 4b, the common electrode 13 is located above the first common electrode compensation lines 14. A second insulation layer 16 is provided between the first common electrode compensation lines 14 and the common electrode 13, and each of the first common electrode compensation lines 14 is configured to be in electrical connection with the common electrode 13 via a second via-hole V2 passing through the second insulation layer 16.

By way of example, during practical implementation, in the above array substrate provided by an exemplary embodiment of the invention, when each of the first common electrode compensation lines 14 comprise the first compensation line 141 and the second compensation line 142, as illustrated in FIG. 4a, the first compensation line 141 is configured to be in electrical connection with the common electrode 13 via the second via-hole V2 passing through the second insulation layer 16, when the first signal line 11 is located above the second signal line 12.

Alternatively, as illustrated in FIG. 4b, the second compensation line 142 is configured to be in electrical connection with the common electrode 13 via the second via-hole V2 passing through the second insulation layer 16, when the second signal line 12 is located above the first signal line 11.

Figure 5A:
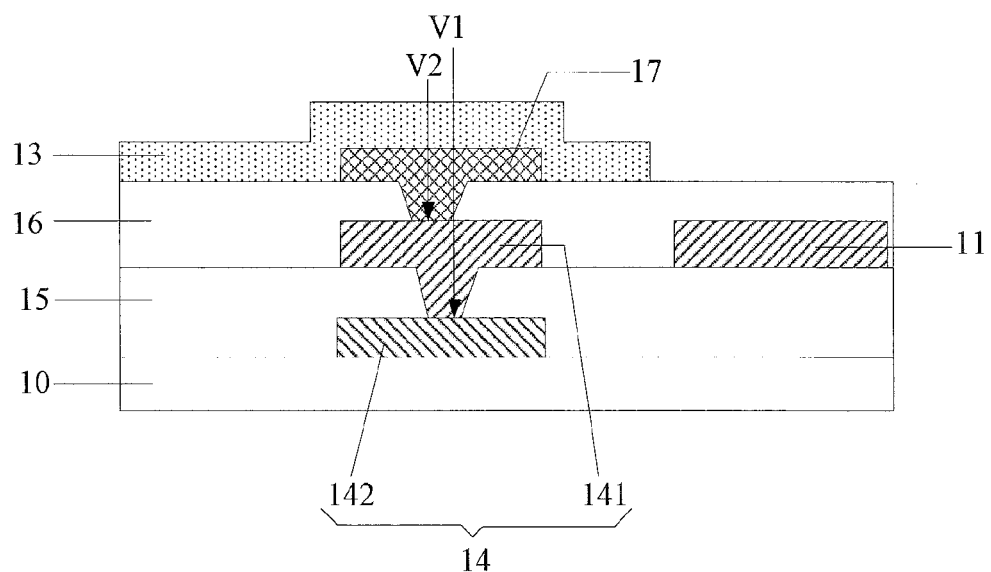
FIG. 5a to FIG. 6b are schematic cross section views illustrating an array substrate comprising a second common electrode compensation line, provided by exemplary embodiments of the invention, respectively.
Figure 5B:
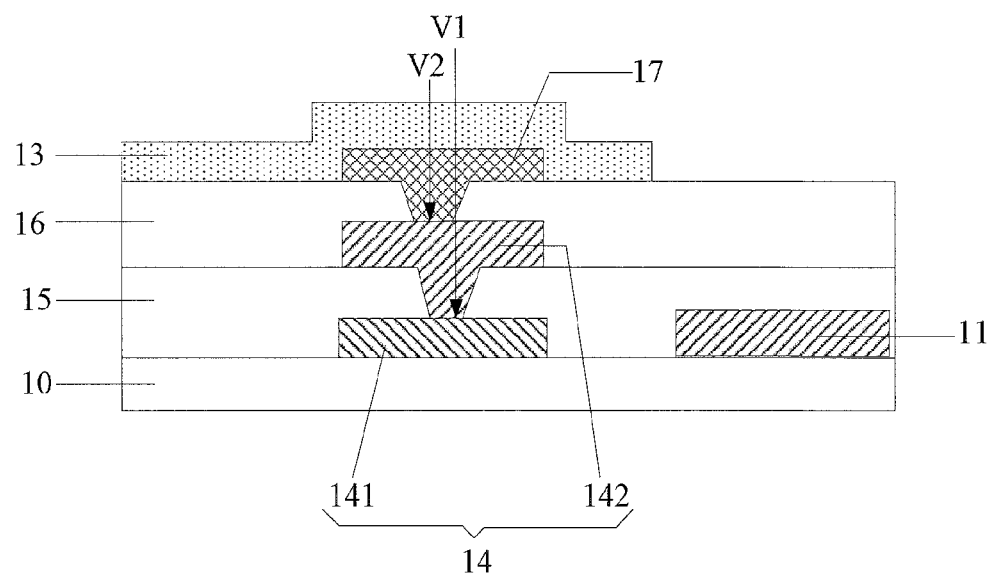

During practical implementation, in the above array substrate provided by an exemplary embodiment of the invention, for further stabilizing the voltage of the common electrode, as illustrated in FIGS. 5a and 5b, it further comprises a second common electrode compensation line 17 located between the second insulation layer 16 and the common electrode 13. An orthographic projection of the second common electrode compensation line 17 on the substrate 10 overlaps at least partially an orthographic projection of the first common electrode compensation line 14 on the substrate 10, and the first common electrode compensation line 14 is configured to be in electrical connection with one corresponding second common electrode compensation line 17 via a via-hole while the corresponding second common electrode compensation line 17 is in turn configured to be in direct electrical connection with the common electrode 13.

Though the voltage of the common electrode may be further stabilized by adding the second common electrode compensation line, it also increases one stage of patterning process. Therefore, during practical implementation, it is determined whether to arrange the second common electrode compensation line according to practical situation.

By way of example, in the above array substrate provided by an exemplary embodiment of the invention, due to relatively low electrical resistivity of metal, the material of the second common electrode compensation line is chosen as metal.

Since metal materials typically functions as light-shielding materials, hereby, in the above array substrate provided by an exemplary embodiment of the invention, an orthographic projection of the second common electrode compensation line on the substrate coincides with an orthographic projection of the first common electrode compensation line on the substrate. As such, it may be ensured that not only is the influence of the arrangement of the second common electrode compensation line onto the aperture ratio minimized but also the electrical resistance of the second common electrode compensation line is minimized.

Figure 6A:
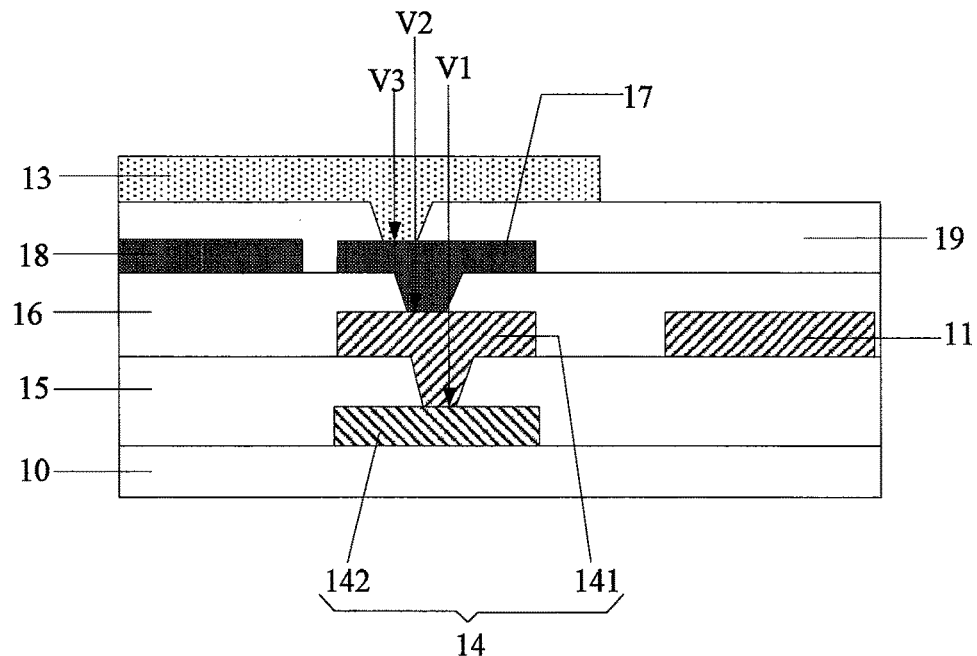
Figure 6B:
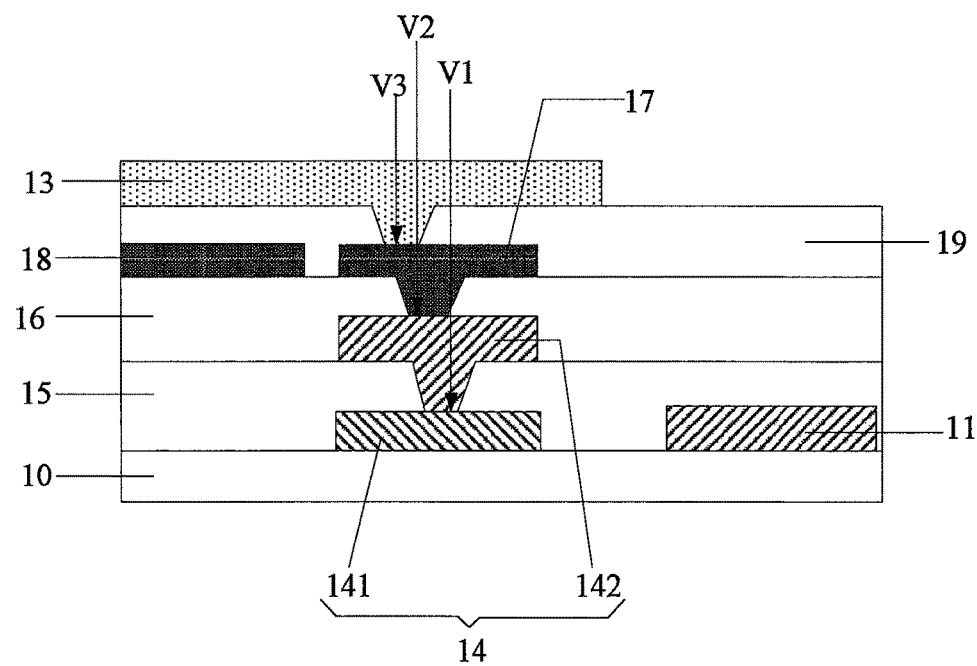

Alternatively, during practical implementation, in the above array substrate provided by an exemplary embodiment of the invention, as illustrated in FIG. 6a and FIG. 6b, it further comprises a pixel electrode 18 provided between the second insulation layer 16 and the common electrode 13, a second common electrode compensation line 17 which is formed by the same material as that of the pixel electrode 18 and arranged in a same layer where the pixel electrode 18 is located, and a third insulation layer 19 provided between the pixel electrode 18 and the common electrode 13. An orthographic projection of the second common electrode compensation line 17 on the substrate 10 is arranged to cover an orthographic projection of the first common electrode compensation line 14 on the substrate 10; and the first common electrode compensation line 14 is configured to be in electrical connection with one corresponding second common electrode compensation line 17 via a via-hole while the corresponding second common electrode compensation line 17 is in turn configured to be in electrical connection with the common electrode 13 via a third via-hole V3 passing through the third insulation layer 19.

As such, hereby, by altering original pattern upon formation of the pixel electrode, a pattern of the pixel electrode and a pattern of the second common electrode compensation line may be formed simultaneously by a single stage patterning process without addition of any processes for preparing only the second common electrode compensation line individually, such that the preparation process steps may be simplified and production cost may also be saved.

It should be noticed that, the second common electrode compensation line provided by an exemplary embodiment of the invention is insulated from the first signal lines, the second signal lines and the pixel electrode.

In an exemplary embodiment of the invention, during practical implementation, in the above array substrate, when the first compensation line is located above the second compensation line, by way of example, the first compensation line is configured to be in electrical connection with the second common electrode compensation line via a via-hole; and when the second compensation line is located above the first compensation line, by way of example, the second compensation line is configured to be in electrical connection with the second common electrode compensation line via a via-hole. Furthermore, since the deeper the via-hole is, the relatively more difficult the production process may be; then, upon implementation of the electrical connection, two most adjacent layers are chosen for achieving such electrical connection.

During practical implementation, as illustrated in FIG. 5a to FIG. 6b, when the first common electrode compensation line 15 comprises the first compensation line 141 and the second compensation line 142:

As shown in FIG. 5a and FIG. 6a, the first compensation line 141 is configured to be in electrical connection with the second common electrode compensation line 17 via the second via-hole V2 passing through the second insulation layer 16, when the first signal line 11 is located above the second signal line 12.

As shown in FIG. 5b and FIG. 6b, the second compensation line 142 is configured to be in electrical connection with the second common electrode compensation line 17 via the second via-hole V2 passing through the second insulation layer 16, when the second signal line 12 is located above the first signal line 11.

By way of example, in the above array substrate provided by an exemplary embodiment of the invention, other structures or film layers such as thin film transistor and the like may be arranged on the substrate. Since the configuration of these structures and film layers are identical to those in the prior art, then detailed depictions will not be made herein.

Next, taking the array substrate as illustrated in FIG. 5a and FIG. 6a for example, its preparation method is explained as below:

First Method Embodiment

Figure 7A:
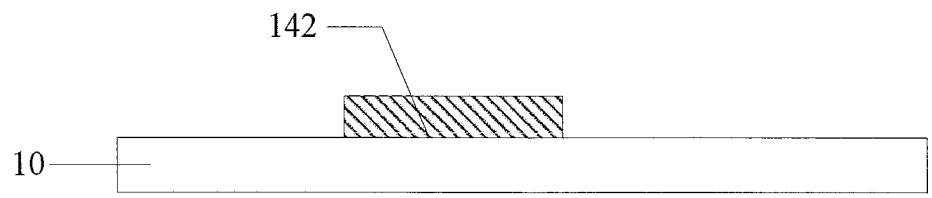
FIG. 7a to FIG. 7e are schematic cross section views of the array substrate after implementing steps according to a first method embodiment of the invention, respectively.
Figure 7B:
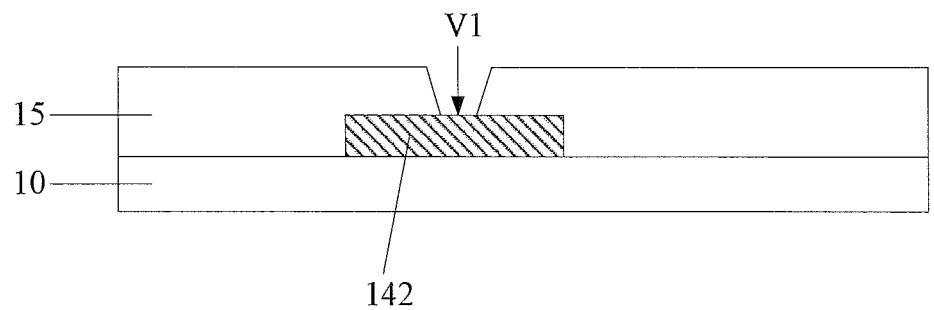
Figure 7C:
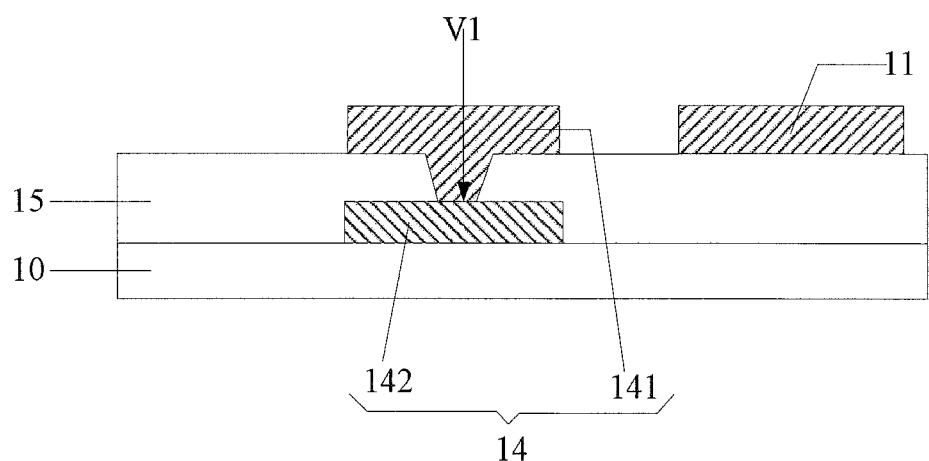
Figure 7D:
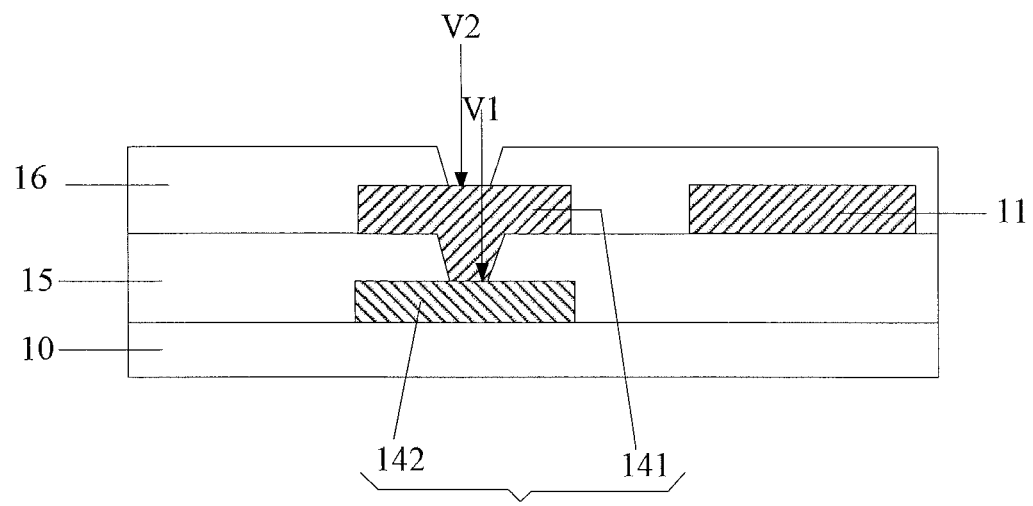
Figure 7E:
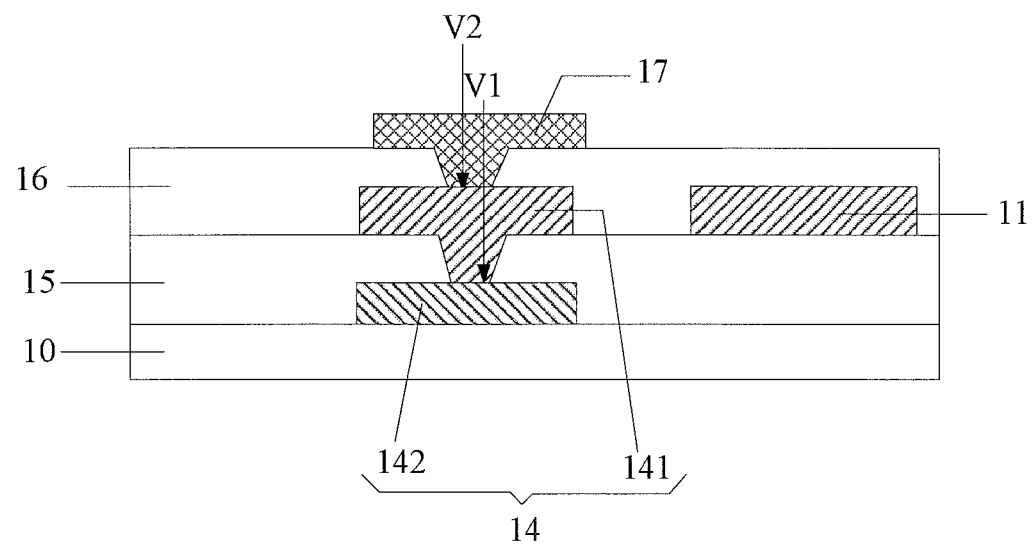

Taking the array substrate as illustrated in FIG. 5a for example, the preparation of the array substrate comprises steps as below:

(1) Forming a pattern of a second signal line (not illustrated in FIG. 7a) and a pattern of a second compensation line 142 on the substrate 10, by a single stage patterning process, as illustrated in FIG. 7a;

(2) Forming a pattern of a first insulation layer 15, by a single stage patterning process, wherein the pattern of the first insulation layer 15 comprises at least a first via-hole V1 for connecting a first compensation line 141 with the second compensation line 142, as illustrated in FIG. 7b;

(3) Forming a pattern of a first signal line 11 and a pattern of a first compensation line 141, by a single stage patterning process, wherein the first compensation line 141 is arranged to be in electrical connection with the second compensation line 142 via the first via-hole V1, as illustrated in FIG. 7c;

(4) Forming a pattern of a second insulation layer 16, by a single stage patterning process, wherein the pattern of the second insulation layer 16 comprises at least a second via-hole V2 for connecting the first compensation line 141 with the second common electrode compensation line 17, as illustrated in FIG. 7d;

(5) Forming a pattern of a second common electrode compensation line 17, by a single stage patterning process, wherein the second common electrode compensation line 17 is arranged to be in electrical connection with the first compensation line 141 via the second via-hole V2, as illustrated in FIG. 7e;

(6) Forming a pattern of a common electrode 13, by a single stage patterning process, wherein the common electrode 13 is arranged to be directly in electrical connection with the second common electrode compensation line 17, as illustrated in FIG. 5a.

Second Method Embodiment

Figure 8A:
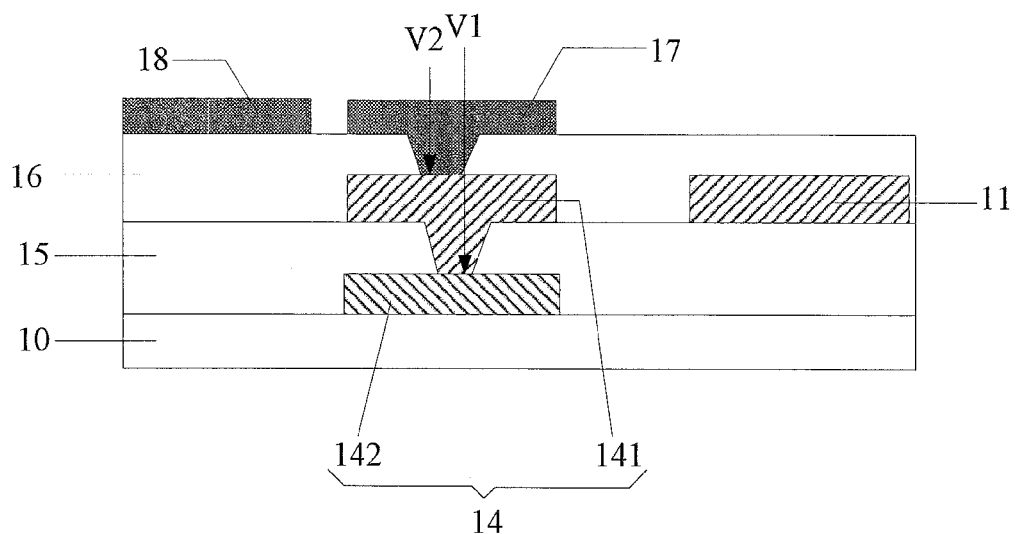
FIG. 8a and FIG. 8b are schematic cross section views of the array substrate after implementing steps according to a second method embodiment of the invention, respectively.

Taking the array substrate as illustrated in FIG. 6a for example, the preparation of the array substrate comprises not only the steps (1)-(4) of the first method embodiment, but also the steps as below:

(5) Forming a pattern of the second common electrode compensation line 17 and a pattern of a pixel electrode 18, by a single stage patterning process, wherein the second common electrode compensation line 17 is arranged to be in electrical connection with the first compensation line 141 via the second via-hole V2, as illustrated in FIG. 8a.

Figure 8B:
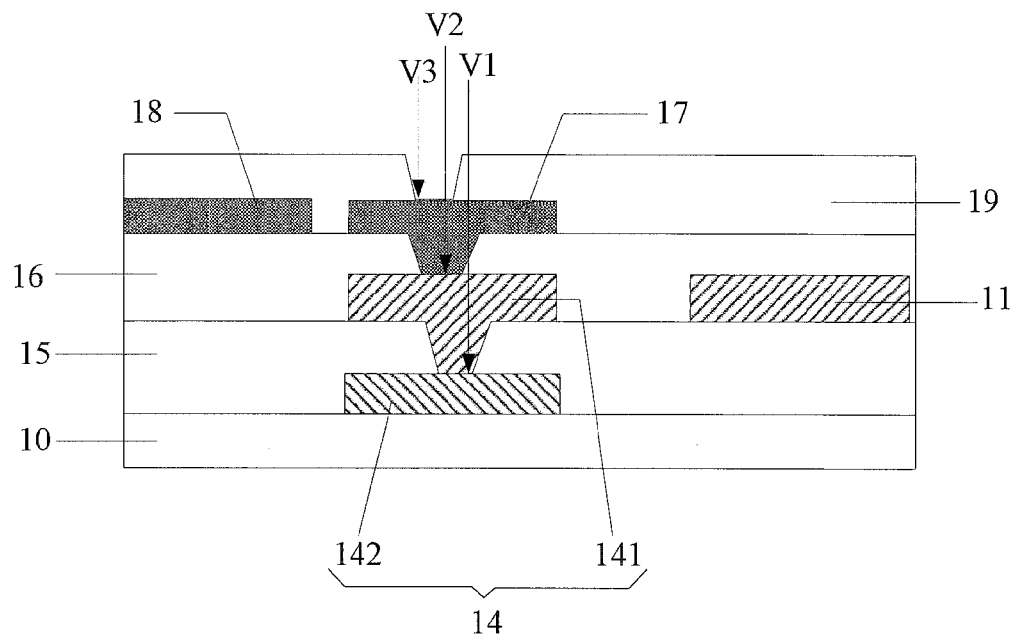

(6) Forming a pattern of a third insulation layer 19 by a single stage patterning process, wherein the pattern of the third insulation layer 19 contains at least a third via-hole V3 for connecting the second common electrode compensation line 17 with a common electrode 13, as illustrated in FIG. 8b;

(7) Forming a pattern of a common electrode 13 by a single stage patterning process, wherein the common electrode 13 is arranged to be in electrical connection with the second common electrode compensation line 17 via the third via-hole V3, as illustrated in FIG. 6a.

Accordingly, on the basis of the same inventive concept, a liquid crystal display panel is provided by an exemplary embodiment of the invention, comprising the above array substrate provided by above exemplary embodiments. Since the problem solving principle of the liquid crystal display panel is similar to that of the above array substrate, the specific implementation of the liquid crystal display panel may refer to the implementation of the aforementioned array substrate, without repeating such contents any more.

Accordingly, on the basis of the same inventive concept, a display device is provided by an exemplary embodiment of the invention, comprising the above liquid crystal display panel provided by the above exemplary embodiments of the invention. For example, the display device may be products or components with display functionality, such as Mobile Phone, Tablet PC, Television, Monitor, Laptop, Digital Photo Frame, Navigator, and so on. The specific implementation of the display device may refer to the implementation of the aforementioned liquid crystal display panel, without repeating such contents any more.

By way of example, an array substrate, a liquid crystal display panel and a display device are provided by the exemplary embodiments of the invention, with first common electrode compensation lines being arranged within pixel regions which correspond to pixels provided with a minimal transmittance, by which first common electrode compensation lines, a common electrode is charged so as to ensure a constant voltage on the common electrode. Moreover, since the first common electrode compensation lines are configured to overlap neither first signal lines nor second signal lines, a repairmen of the first signal lines or the second signal lines will not be adversely affected in case that there is short-circuit or open-circuit thereon. Besides, since the common electrode compensation lines are arranged within pixel regions provided with the lowest transmittance, the influence onto overall transmittance of the display panel is minimized relatively.

Although the disclosure is described in view of the attached drawings, the embodiments disclosed in the drawings are only intended to illustrate the preferable embodiment of the present application exemplarily, and should not be deemed as a restriction thereof.

Various embodiments of the present application have been illustrated progressively, the same or similar parts of which can be referred to each other. The differences between each embodiment and the others are described in emphasis.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments of the general concept of the present application have been shown and described, it would be appreciated by those skilled in the art that various changes or modifications may be made in these embodiments without departing from the principles and spirit of the disclosure, the scope of which is defined in the claims and their equivalents.

It should be noted that the terms, such as "comprising", "including" or "having", should be understood as not excluding other elements or steps and the word "a" or "an" should be understood as not excluding plural of said elements or steps. Further, any reference number in claims should be understood as not limiting the scope of the present application.

What is claimed is:

1. An array substrate, comprising:
    a substrate;
    a plurality of first signal lines and a plurality of second signal lines on the substrate, the plurality of first signal lines being arranged in parallel in a first layer and the plurality of second signal lines being also arranged in parallel in a second layer, the plurality of first signal lines being intersected with and insulated from the plurality of second signal lines;
    a plurality of pixel regions each of which is defined collectively by every two adjacent first signal lines and every two adjacent second signal lines; and
    common electrodes located within each respective pixel region defined by the adjacent first signal lines and the adjacent second signal lines,
    wherein a plurality of first common electrode compensation lines are provided, each of which is provided within each respective pixel region which corresponds to a pixel with a lowest transmittance and is directly in physical electrically connection with a corresponding common electrode within the pixel region;
    wherein the first common electrode compensation line is insulated from both the first signal lines and the second signal lines.

2. The array substrate according to claim 1, wherein the pixel with the lowest transmittance is a blue pixel.

3. The array substrate according to claim 1, wherein each of the first common electrode compensation lines comprises a first compensation line which is arranged in a same layer as the first signal lines.

4. The array substrate according to claim 3, further comprising a first insulation layer provided between the first layer in which the first signal lines are located and the second layer in which the second signal lines are located;
    wherein each of the first common electrode compensation lines further comprises a second compensation line which is arranged in a same layer as the second signal lines; and
    wherein an orthographic projection of the second compensation line on the substrate overlaps at least partially an orthographic projection of respective first compensation line on the substrate, the second compensation line being in electrical connection with the first compensation line via a first via-hole passing through the first insulation layer.

5. The array substrate according to claim 1, wherein the first layer in which the first signal lines are located differs from the second layer in which the second signal lines are located.

6. The array substrate according to claim 1, wherein the common electrodes are located above the first common electrode compensation lines;
    wherein a second insulation layer is provided between the first common electrode compensation line and the common electrodes, and
    wherein each of the first common electrode compensation lines is configured to be in electrical connection with the corresponding common electrode via a second via-hole passing through the second insulation layer.

7. The array substrate according to claim 2, wherein the common electrodes are located above the first common electrode compensation line;
    wherein a second insulation layer is provided between the first common electrode compensation line and the common electrodes, and
    wherein each of the first common electrode compensation lines is configured to be in electrical connection with the corresponding common electrode via a second via-hole passing through the second insulation layer.

8. The array substrate according to claim 3, wherein the common electrodes are located above the first common electrode compensation line;
    wherein a second insulation layer is provided between the first common electrode compensation line and the common electrodes, and
    wherein each of the first common electrode compensation lines is configured to be in electrical connection with the corresponding common electrode via a second via-hole passing through the second insulation layer.

9. The array substrate according to claim 4, wherein the common electrodes are located above the first common electrode compensation line;
    wherein a second insulation layer is provided between the first common electrode compensation line and the common electrodes, and
    wherein each of the first common electrode compensation lines is configured to be in electrical connection with the corresponding common electrode via a second via-hole passing through the second insulation layer.

10. The array substrate according to claim 9, wherein the first compensation line of each of the first common electrode compensation lines is configured to be in electrical connection with the corresponding common electrode via the second via-hole, when the first signal lines are located above the second signal lines.

11. The array substrate according to claim 9, wherein each second compensation line is configured to be in electrical connection with the corresponding common electrode via the second via-hole passing through the second insulation layer, when the second signal lines are located above the first signal lines.

12. The array substrate according to claim 6, further comprising a plurality of second common electrode compensation line, each of which is provided between the second insulation layer and the common electrodes;

wherein an orthographic projections of each second common electrode compensation line on the substrate overlaps at least partially an orthographic projection of respective first common electrode compensation line on the substrate, and wherein each of the first common electrode compensation lines is configured to be in electrical connection with one corresponding second common electrode compensation line via a via-hole while the corresponding second common electrode compensation line is in turn configured to be in direct electrical connection with the corresponding common electrode.

13. The array substrate according to claim 12, wherein the second common electrode compensation lines are formed by a metallic material.

14. The array substrate according to claim 6, further comprising a plurality of pixel electrodes each of which is provided between the second insulation layer and the common electrodes, a plurality of second common electrode compensation lines which are formed by the same material as that of the pixel electrode and arranged in the same layer as the pixel electrode, and a third insulation layer provided between the pixel electrode and the common electrode;

wherein an orthographic projection of each second common electrode compensation line on the substrate is arranged to cover an orthographic projection of respective first common electrode compensation line on the substrate; and wherein each of the first common electrode compensation lines is configured to be in electrical connection with one corresponding second common electrode compensation line via a via-hole while the corresponding second common electrode compensation line is in turn configured to be in electrical connection with the corresponding common electrode via a third via-hole passing through the third insulation layer.

15. The array substrate according to claim 1, wherein one type of the first signal lines and the second signal lines are gate lines, whereas another one type of the first signal lines and the second signal lines are data lines.

16. The array substrate according to claim 2, wherein one of the first signal line and the second signal line is a gate lines, while the other of the first signal line and the second signal line is a data line.

17. The array substrate according to claim 3, wherein one of the first signal line and the second signal line is a gate line, while the other of the first signal line and the second signal line is a data line.

18. The array substrate according to claim 4, wherein one of the first signal line and the second signal line is a gate line, while the other of the first signal line and the second signal line is a data line.

19. A liquid crystal display panel, comprising the array substrate according to claim 1.

20. A display device, comprising the liquid crystal display panel according to claim 19.

* * * * *